(12) United States Patent
Andersen

(10) Patent No.: US 10,164,581 B2
(45) Date of Patent: Dec. 25, 2018

(54) SELF-OSCILLATING AMPLIFIER WITH HIGH ORDER LOOP FILTER

(71) Applicant: ICEpower a/s, Søborg (DK)

(72) Inventor: Kennet Skov Andersen, Søborg (DK)

(73) Assignee: ICEPOWER A/S, Søborg (DK)

( * ) Notice: Subject to any disclaimer, the term of this patent is extended or adjusted under 35 U.S.C. 154(b) by 0 days.

(21) Appl. No.: 15/525,182

(22) PCT Filed: Nov. 27, 2015

(86) PCT No.: PCT/EP2015/077929
§ 371 (c)(1),
(2) Date: May 8, 2017

(87) PCT Pub. No.: WO2016/091620
PCT Pub. Date: Jun. 16, 2016

(65) Prior Publication Data
US 2017/0324382 A1 Nov. 9, 2017

(30) Foreign Application Priority Data

Dec. 8, 2014 (DK) .................................. 2014 00713
Jun. 22, 2015 (DK) .................................. 2015 00358

(51) Int. Cl.
*H03F 1/26* (2006.01)
*H03F 3/217* (2006.01)
*H03F 3/183* (2006.01)

(52) U.S. Cl.
CPC .............. *H03F 1/26* (2013.01); *H03F 3/183* (2013.01); *H03F 3/217* (2013.01);
(Continued)

(58) Field of Classification Search
CPC ........................................................ H03F 1/26
See application file for complete search history.

(56) References Cited

U.S. PATENT DOCUMENTS 6,947,712 B2 * 9/2005 Sun ....................... H03F 1/3247
330/149
7,157,969 B2 * 1/2007 Candy ....................... H03F 1/34
330/10
(Continued)

FOREIGN PATENT DOCUMENTS

GB  2096850 A  10/1982
WO  WO-200709442 A2  1/2007

OTHER PUBLICATIONS

International Search Report and Written Opinion dated Feb. 15, 2016 for PCT Application No. PCT/EP2015/077929 filed Nov. 27, 2015 published as WO 2016/091620 on Jun. 16, 2016 which is the parent application to the instant application; 11 pages.
(Continued)

*Primary Examiner* — Patricia T Nguyen
(74) *Attorney, Agent, or Firm* — Harness, Dickey & Pierce, P.L.C.; Anthony G. Fussner

(57) ABSTRACT

A self-oscillating amplifier system is disclosed. The system comprises a pulse modulator, a switching power amplification stage and a demodulation filter. Moreover, the system comprises a compensator including a forward filter which is a high order filter including a second order pole pair and a second order zero pair. Hereby it is possible to decrease the phase turn at low frequencies for better stability and increasing the gain of the control loop within the desired bandwidth.

9 Claims, 3 Drawing Sheets

(52) U.S. Cl.
CPC .... *H03F 2200/03* (2013.01); *H03F 2200/129* (2013.01); *H03F 2200/171* (2013.01)

(56) References Cited

U.S. PATENT DOCUMENTS

| | | | |
|---|---|---|---|
| 2007/0057721 A1 | 3/2007 | Risbo et al. | |
| 2007/0216491 A1* | 9/2007 | Frederiksen | H03F 1/08 331/167 |
| 2008/0042746 A1* | 2/2008 | Kozak | H03F 1/32 330/251 |
| 2012/0235742 A1* | 9/2012 | Bostrom | H03F 3/217 330/207 A |

OTHER PUBLICATIONS

Wenfeng Yu et al: "A low THD analog Class D Amplifier based on self-oscillating modulation with complete feedback network", Circuits and Systems, 2009, ISCAS 2009. IEEE International Symposium on, IEEE, Piscataway, NJ, USA, May 24, 2009, pp. 2729-2732; ISBN: 978-1-4244-3827-3; abstract, p. 2731, left-hand column, line 1-right-hand column, line 14; figures 4-6.

\* cited by examiner

SELF-OSCILLATING AMPLIFIER WITH HIGH ORDER LOOP FILTER

This patent application is a U.S. national stage filing under 35 U.S.C. § 371 of International Application No. PCT/EP2015/077929 filed Nov. 27, 2015 (published as WO 2016/091620 on Jun. 16, 2016), which claims priority of Denmark Application No. PA201400713 filed Dec. 8, 2014 and Denmark Application No. PA201500358 filed Jun. 22, 2015. The disclosures of the applications identified in this paragraph are incorporated herein by reference in their entirety.

FIELD OF THE INVENTION

This invention relates to the field of DC-DC and DC-AC power conversion, with particular relevance for high definition switching audio power amplification.

BACKGROUND OF THE INVENTION

Switching Class D audio amplifiers have found increasing use in the industry in recent years, due to the improvements in output stage switching devices and equally in modulation and feedback control methods. The classical switching power amplifier system consists of a pulse modulator, for converting an analog or digital source into a pulse-modulated signal, which is amplified by a switching power stage. A passive demodulation filter reproduces the power modulated power signal.

Most switching class D amplifiers are based on variants of Pulse Width Modulation (PWM). The challenges in switching amplifier design relates to the fact that PWM is in effect a multiplication/mixing between the input and power supply variable, this is equivalent to zero power supply rejection.

The switching power stage causes distortion from numerous contributions since power Metal-Oxide-Semiconductor field-effect transistors (MOSFETs) have parasitics and need to be driven by differentiated turn-off/turn-on delays. The output filter is non-linear and contributes with significant addition of frequency dependent output impedance, which counters the desire for ideal voltage control of the speaker load.

Further, electromagnetic interference (EMI) is an important aspect to consider. The power stage, passive filter and the connecting cables (although filtered) source EMI. Perfect demodulation is not possible, leaving residuals in the connecting cables.

Achieving Robust Stability & Excellent audio performance is many times a very complicated task, given the real world and test bench parameter space for load perturbations, input stimuli and power supply range.

The published PCT-application WO 2007099442 A1 discloses a general structure of an oscillating modulator with particular relevance to class D amplifiers.

There is therefore still a need for an improved system and method for high definition switching audio amplifiers.

SUMMARY OF THE INVENTION

It is therefore an object of the present invention to provide a self-oscillating amplifier system which alleviates all or at least some of the above-discussed drawbacks of the presently known systems.

This object is achieved by means of a self-oscillating amplifier system as defined in the appended claims.

According to one aspect of the present invention, there is provided a self-oscillating amplifier system having an input and an output, said system comprising:
a pulse modulator for modulating an input signal to form a pulse modulated signal;
a switching power amplification stage having switching output for amplification of the pulse modulated signal to form a switching output signal;
a demodulation filter including a second order pole pair, to demodulate the switching output signal;
characterized in that the system further comprises a compensator including a forward filter which is a high order filter including a second order pole pair and a second order zero pair. Hereby a self-oscillating amplifier system with decreased phase turn at low frequencies and increased gain of the control loop within the bandwidth is presented.

The present invention is based on the realization that currently available systems have limited loop gain at high frequencies (e.g. 18-20 kHz) and that they also exhibit stability issues, in the form of high phase turn at low frequencies, in particular for systems which include a DC-servo loop. Moreover, the inventors realized that the second order demodulation filter, in particular the second order poles of the demodulation filter need to be compensated for in self-oscillating amplifier systems. Thus, by providing a high order forward filter in the system, a forward filter which includes a second order pole pair and second order zero pair, one can construct a system with less phase turn at low frequencies, steep cut-off after the desired bandwidth which results in a high loop gain in the self-oscillating loop within the audio band, and also compensate for the demodulation filter poles.

In one exemplary embodiment the self-oscillating amplifier system further comprises a DC-servo loop and a switch to couple a gain into the DC-servo loop from an output of the compensator. The DC-servo loop is used to reduce DC-offset at the output of the system, and can furthermore be used to minimize an audible pop at the output during start-up of the system. The forward filter improves the stability of the system when a DC-servo is used since there is less phase turn at low frequencies. Low phase turn is preferable for stability reasons when having a gain from the compensator as input to the DC-servo included in the DC-servo loop. Thus, the DC-servo receives input from the output of the demodulation filter and from an output of the compensator and then generates a DC-servo output to the system input.

In another exemplary embodiment the self-oscillating amplifier system further comprises a first feedback path applied from the switching output to said compensator. This first feedback path keeps the switch frequency within the switching power amplification stage from locking on a noise signal.

In another exemplary embodiment the compensator further includes a second forward filter which is a low-pass filter. This second forward filter compensates for the limited high frequency gain of the first forward filter.

In yet another exemplary embodiment the system comprises at least three feedback loops.

According to another aspect of the invention there is provided a self-oscillating amplifier system having an input signal and an output signal, and where the system further comprises:
a forward path between the input and the output of the system, where the forward path includes a compensator, a pulse modulator, a switching power amplification stage and a demodulation filter to provide an amplified input signal at the output of the system; and wherein the compensator includes a forward filter which is a high order filter including a second order pole pair and a second order zero pair.

With this aspect of the invention, similar advantages and preferred features are present as in the previously discussed aspect of the invention.

These and other features of the present invention will in the following be further clarified with reference to the embodiments described hereinafter.

BRIEF DESCRIPTION OF THE DRAWINGS

For exemplifying purposes, the invention will be described in closer detail in the following with reference to embodiments thereof illustrated in the attached drawings, wherein.

DETAILED DESCRIPTION

In the following detailed description, preferred embodiments of the present invention will be described. However, it is to be understood that features of the different embodiments are exchangeable between the embodiments and may be combined in different ways, unless anything else is specifically indicated. Even though in the following description, numerous specific details are set forth to provide a more thorough understanding of the present invention, it will be apparent to one skilled in the art that the present invention may be practiced without these specific details. In other instances, well known constructions or functions are not described in detail, so as not to obscure the present invention.

Figure 1:
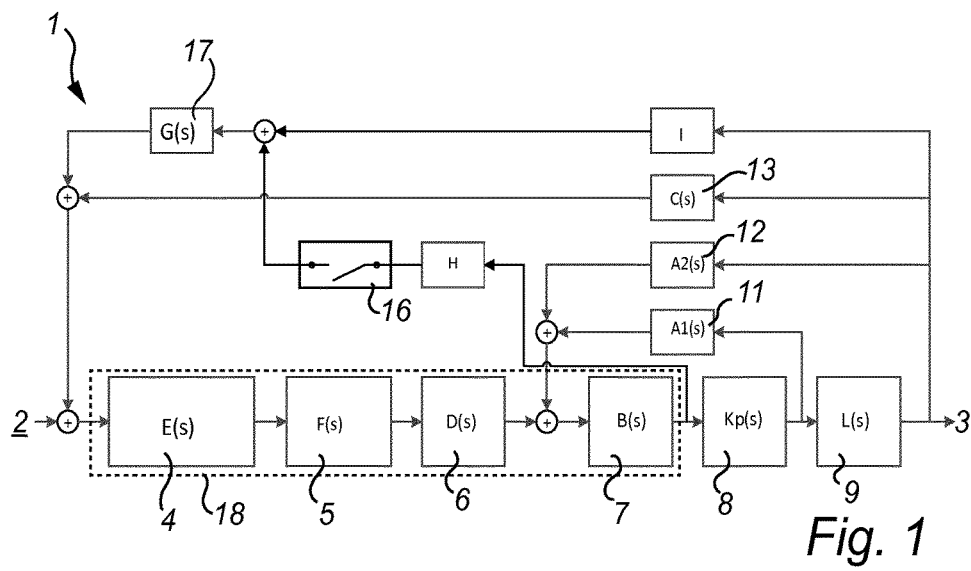
FIG. 1 illustrates a block diagram representation of a self-oscillating amplifier system in accordance with an embodiment of the present invention.

FIG. 1 illustrates a block-diagram representation of a self-oscillating amplifier system 1 in accordance with an embodiment of the invention. The system 1 comprises a set of compensator 18 forward blocks 4, 5, 6 and 7 each having a transfer function E(s), F(s), D(s) and B(s) respectively. The system further comprises a set of feedback blocks 11, 12, and 13 each having a transfer function A1($s$), A2($s$) and C(s) respectively. The other blocks in the forward path (the path from the amplifier input 2 to the amplifier output 3) are the switching power stage 8, and the demodulation filter 9 as known in the art. Continuingly, the system 1 further includes a DC-servo 17, having a transfer function G(s) with an input gain I, and also a switchable input gain H (switchable by means of a switching unit 16). The DC-servo 17 together with the switchable feedback from the compensator 18 can be utilized to provide for a start-up minimization as described in PCT Application No. PCT/EP2015/071938, by the same applicant, incorporated herein by reference.

One forward block 4 (high order filter) of the compensator 18 includes a second order pole pair and a second order zero pair:

$$E(s) = \frac{A_Z \cdot s^2 + B_Z \cdot s + C_Z}{A_P \cdot s^2 + B_P \cdot s + C_P}$$

The second order poles can be used for shaping the loop, and constructing a steep cut-off after the desired bandwidth. The loop being the global feedback loop 13 which has a transfer function C(s) (or G(s) during start-up). The steep cut-off is desired for having as high loop gain as possible in the self-oscillating loop. Furthermore, the second order poles can construct a filter with less phase turn at low frequencies. Low phase turn is advantageous for stability reasons in systems having a DC-servo 17 and switch 16, in particular for those situations/moments when the switch 16 is on/conducting and the gain H is connected as input to the DC-servo 17. Low phase turn can in this context be having a phase turn of less than −180 degrees in a loop (i.e. between 0 and −180 degrees). Closing the switch 16 and thereby enabling an input to the DC-servo 17 through the switch 16 and with the gain H before startup increases the gain in the integrator within the DC-servo 17 and therefore it increases the frequency of the DC-servo 17. This moves up the phase turn (moves up to a higher frequency), and for stability reasons this limits the low frequency phase turn allowed in the forward block 4, 5, 6 and 7. Having a filter 4 with second order poles allows us to construct a system 1 with less phase turn at low frequencies.

The second order zeros may also be used to shape the loop, and compensate for the demodulation filter's 9 poles. The demodulation filter 9 may be simplified to a low pass LCR filter, having a transfer function L(s), including an inductor and a capacitor and a resistor. The demodulation filter 9 is generally a second order demodulation filter so for precise compensation for the demodulation filter 9, a filter 4 in the forward block having second order zeros should be used. The demodulation filter 9 can be a passive filter. Furthermore in one exemplary embodiment the compensator 18 forward block may include two second order filters (not shown). In other words, in reference to FIG. 1 an additional high order filter having second order poles and second order zeros may be added in series with the first higher order filter 4. This can further increase the loop gain of the system within the audible bandwidth.

The compensator further includes an extra low pass filter 5, having a transfer function:

$$F(s) = \frac{1}{1 + s/D_P}$$

When implementing the second order pole and second order zero filter 4 there will be limited high frequency gain, so for some practical implementations an extra low pass filter 5 can be included. An additional optional filter 6 can be included in the compensator 18, having a transfer function D(s) including a pole and a zero for further increasing the loop gain of the system. However, as mentioned it is optional so the transfer function D(s) may simply, in some exemplary embodiments, be considered to be D(s)=1. Moreover, this additional filter 6, may also be positioned before the high order filter 4, and have a transfer function D(s) including only one pole, or just a gain. The transfer function D(s) may then be chosen to include a low frequency pole and the transfer function C(s) of the feedback filter 13 may include a low frequency zero in order to design a system having a closed loop transfer function that falls off at high frequencies.

The feedback with gain I to the DC-servo 17 is parallel to the outer feedback 13, having a transfer function C(s), but separately implemented by an active circuit (which can be integrated in the DC-servo block 17) to have high gain at low frequencies to ensure low DC offset at the output 3 of the amplifier. The outer loop filter 13 is designed to be dominant in the audio-band in order to compensate for errors caused by the demodulation filter 9. The functions of the feedback blocks 11, 12, 13 are readily understood by those skilled in the art, and detailed discussions are for the sake of brevity omitted in this description. However, in short, the inner feedback filter 11, having a transfer function A1 (s), is dominant at the switch frequency of the switching power stage 8 and is less sensitive to noise that can impact the switch frequency, e.g. causing the switch frequency to lock on a noise signal. Therefore, the inner feedback filter is used to correct power stage related errors locally. One of the outer feedback filters 12, having a transfer function A2(s), is used to increase the stability when the compensator 18 is saturating.

Figure 2:
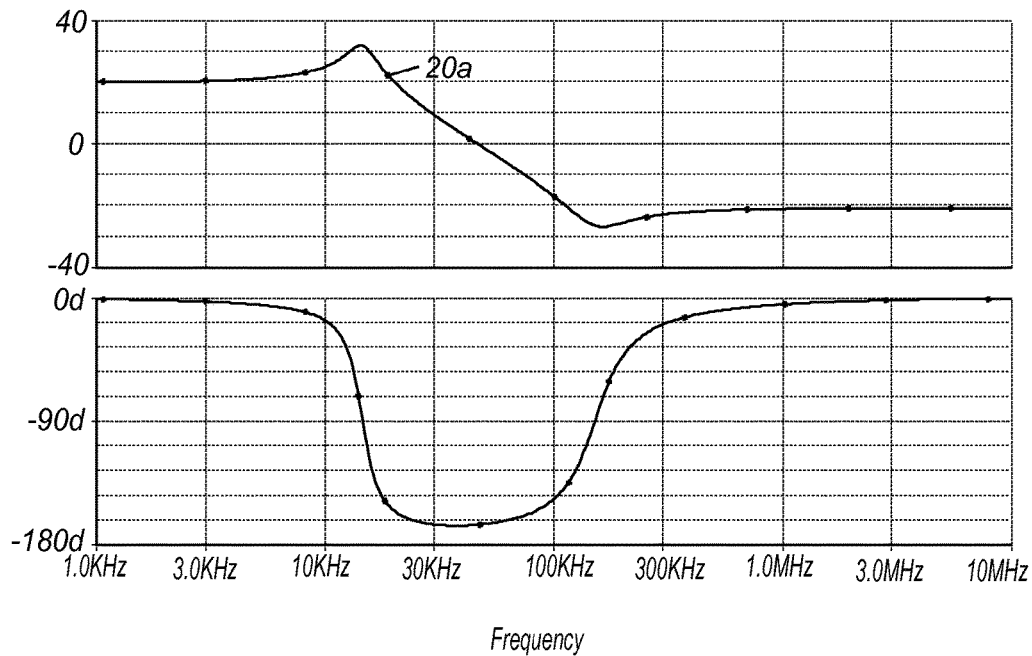
FIG. 2 illustrates the frequency response of a second order pole and second order zero filter in accordance with an embodiment of the present invention.

An example of a transfer function of the higher order filter (ref. 4 in FIG. 1) in the forward block, in this example a second order pole and second order zero filter, is shown in FIG. 2. As one can see, there is a sharp cut off after the desired 20 kHz, indicated by 20a. Moreover, the gain (y-axis in the top graph) up to 20 kHz is 20 dB whereas the gain at high frequencies is −20 dB. And lastly, there is a small phase turn below approximately 3 kHz and above approximately 1 MHz.

Figure 3:
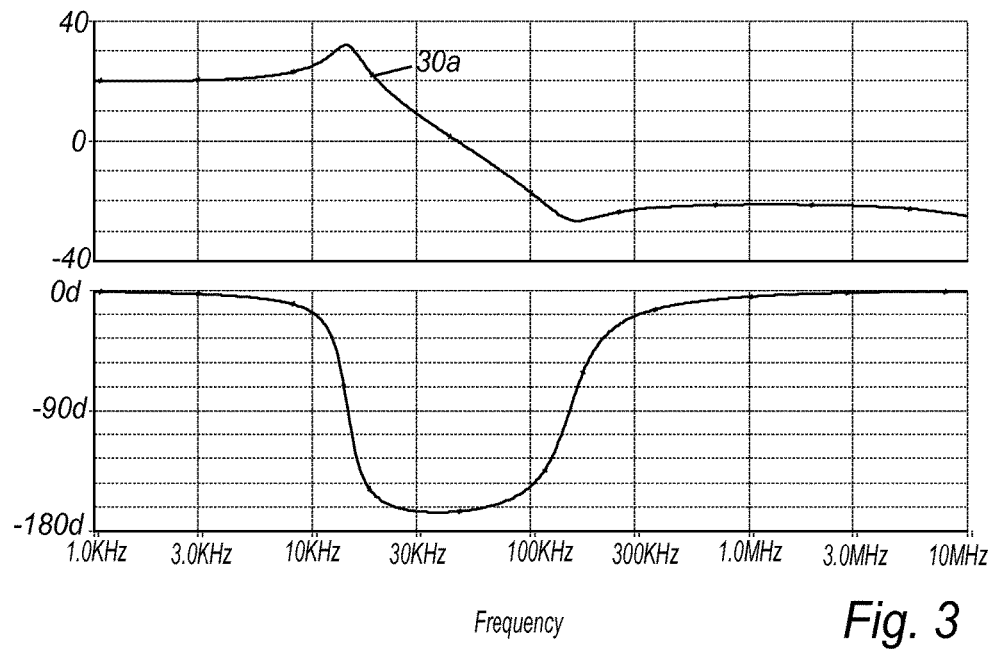
FIG. 3 illustrates the frequency response of a system using a second order pole and second order zero filter, including a pole limited high frequency gain of OP-amp 54 in FIG. 5 in accordance with yet another embodiment of the present invention.

Another example of a transfer function for a higher order filter in the compensator forward block is shown in FIG. 3. In this exemplary embodiment, the filter includes an additional pole, in comparison to the transfer function illustrated in FIG. 2. In one embodiment this could be interpreted as a transfer function of the two combined blocks 4 and 5 in FIG. 1. This can be used (adding an extra pole), for example, in order to compensate for the limited high frequency gain of the first OP-Amp 54 in FIG. 5 if the high order forward filter (4 in FIG. 1) would be realized with that topology, which will be discussed further in reference to FIG. 5. The top graph in FIG. 3 shows that the limited gain is effectively compensated for by the addition of an extra pole.

Figure 4:
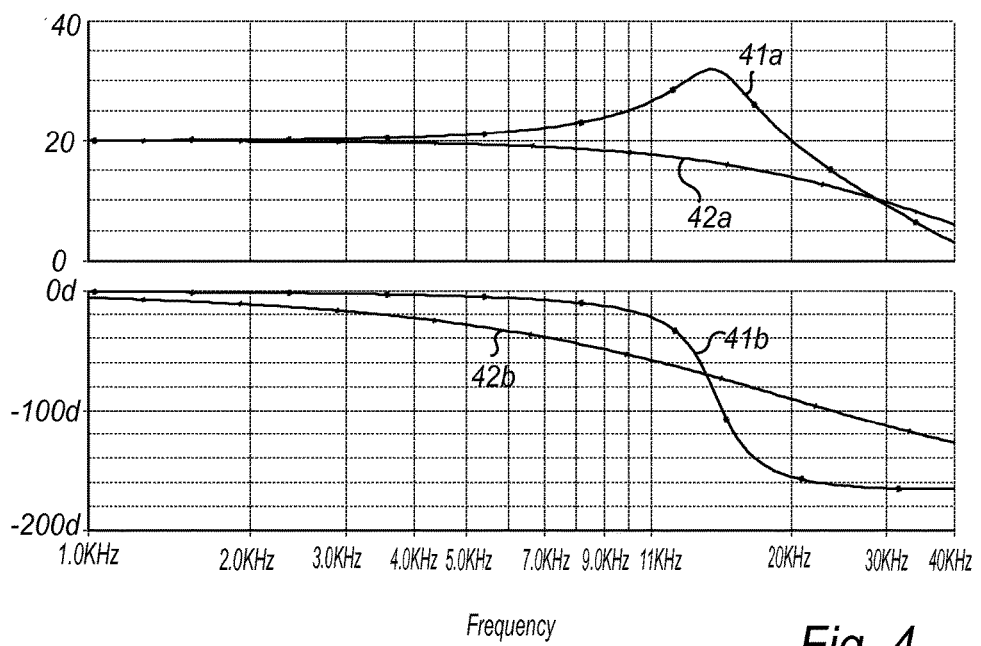
FIG. 4 illustrates a comparison of the frequency responses of a system utilizing a second order filter in accordance with an embodiment of the present invention and two first order filters.

FIG. 4 illustrates a comparison between the transfer functions of a second order filter 41a, 41b and two first order filters 42a, 42b. At low frequencies the two first order filters 42b have more phase turn than the second order filter 41b (e.g. at 2 kHz it is 10 degrees versus 2 degrees). With a DC-servo (17 in FIG. 1) connected through a switch (16 in FIG. 1) with a gain H, the extra phase turn can increase stability problems. Across the 20 kHz bandwidth the second order filter 41a has at least 20 dB gain while the two first order filters 42a have about 6 dB lower gain. This makes less loop gain of the control system (control loop). Further, at high frequencies (above 30 kHz), the two first order filters 42a have higher gain than the second order filter 41a, which makes the low frequency loop gain lower in a self-oscillating amplifier.

Figure 5:
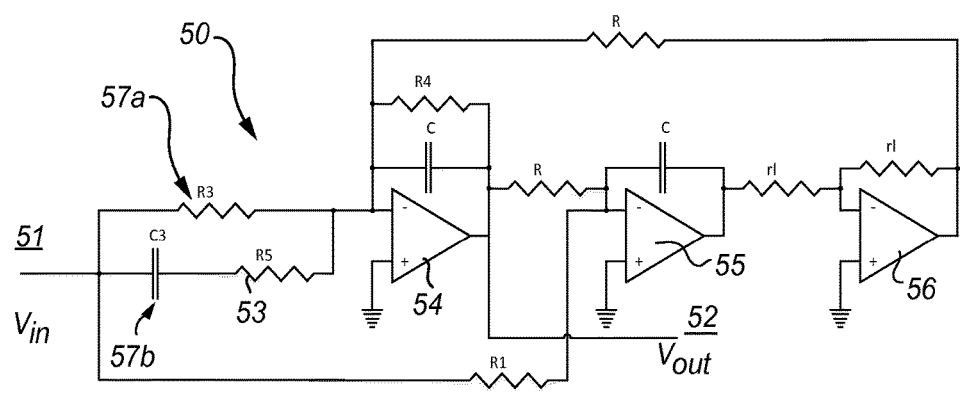
FIG. 5 illustrates a schematic drawing of a high order filter in accordance with yet another embodiment of the present invention.

An example of a practical realization of a high order filter, intended for the compensator forward block, is shown in FIG. 5. The filter 50 has biquad filter topology with three cascaded OP amps 54, 55, 56. The filter 50 has a voltage signal input $V_{in}$ (51) and a voltage signal output $V_{out}$ (52) taken from an output of the first OP amp 54. The filter 50 further has a transfer function having a second order pole pair, second order zero pair. There is a parallel RC-circuit 57 provided between the filter input 51 and an inverting input of the first OP amp 54.

Moreover, the filter 50 comprises an additional resistor 53 connected in series with the capacitor 57b of the RC-circuit at the input, in order to control the high frequency gain. For example, if the resistance R5 of the resistor 53 would be set to zero, the bandwidth of the first Operational amplifier (OP amp) 54 will control the high frequency loop gain of the filter. The pole which is a product of the first OP amp 54 has high variation, thus by using well defined passive components a pole may be introduced at a slightly lower frequency in order to minimize the variation of the "position" of the pole from the first OP amp 54. For example, the resistor 53 can implement a precise pole instead of the more non-precise pole from the OP amp 54. The transfer function E(s) of this particular filter with the resistance R5 being zero:

$$E(s) = \frac{V_{out}}{V_{in}} = \frac{s \cdot s \cdot (C3/C) + s \cdot (1/(C \cdot R3)) + 1/(C \cdot C \cdot R \cdot R1)}{s \cdot s + s \cdot 1/(C \cdot R4) + 1/(C \cdot C \cdot R \cdot R)}$$

The filter circuit illustrated in FIG. 5 can be used for implementation of the forward block 4 in FIG. 1 and furthermore provides a flexible and robust solution. Flexible in terms of pole pair and zero pair variation and robust in terms of OP amp tolerances, i.e. the filter is not very dependent on the performance of the OP amps 54, 55, 56. The invention can be implemented in integrated circuits or in implementations with discrete components. However, the circuit illustrated in FIG. 5 is merely an exemplary embodiment, the filter having a second order poles and a second order zeros can be implemented with other types of filters, such as e.g. twin T filters.

The invention is applicable in high definition switching audio power amplification, such as e.g. switching Class-D audio amplifiers including a self oscillating analog control system, systems including DC-servo and low pop from startup, etc.

The person skilled in the art realizes that the present invention by no means is limited to the preferred embodiments described above. On the contrary, many modifications and variations are possible within the scope of the appended claims. For example, other higher order filter topologies than the ones described in the detailed description are possible, such as e.g. multiple feedback topologies, Sallen-key topologies, etc. Moreover, the higher order filter could be realized as a passive filter.

In the claims, any reference signs placed between parentheses shall not be construed as limiting to the claim. The word "comprising" does not exclude the presence of other elements or steps than those listed in the claim. The word "a" or "an" preceding an element does not exclude the presence of a plurality of such elements.

The invention claimed is:

1. A self-oscillating amplifier system having an input and an output, said system comprising:
   a pulse modulator for modulating an input signal to form a pulse modulated signal;
   a switching power amplification stage having switching output for amplification of the pulse modulated signal to form a switching output signal;

a demodulation filter including a second order pole pair, to demodulate the switching output signal;

wherein the system further comprises a compensator including a forward filter which is a high order filter including a second order pole pair and a second order zero pair thereby enabling a decrease of a phase turn at low frequencies for better stability and increasing a gain of a control loop within the bandwidth.

2. The self-oscillating amplifier system according to claim 1, further comprising a DC-servo loop and a switch to couple a gain into the DC-servo loop from an output of the compensator.

3. The self-oscillating amplifier system according to claim 1, further comprising a first feedback path applied from the demodulating filter output to said input of the system.

4. The self-oscillating system according to claim 3, further comprising a second feedback path applied from the switching output to said compensator.

5. The self-oscillating system according to claim 4, further comprising a third feedback path applied from the demodulating filter output to said compensator.

6. The self-oscillating system according to claim 1, wherein said forward filter is an active filter.

7. The self-oscillating system according to claim 6, wherein said forward filter comprises three cascaded operational amplifiers in a biquad filter topology.

8. The self-oscillating system according to claim 1, wherein said forward filter is a first forward filter and wherein said compensator further includes a second forward filter which is a high order filter including a second order pole pair and a second order zero pair connected in series with the first forward filter.

9. The self-oscillating system according to claim 1, wherein said wherein said compensator further includes a low-pass filter.

* * * * *